(12) United States Patent
Tanaka et al.

(10) Patent No.: US 11,635,072 B2
(45) Date of Patent: Apr. 25, 2023

(54) PUMP

(71) Applicant: Murata Manufacturing Co., Ltd., Kyoto (JP)

(72) Inventors: Nobuhira Tanaka, Kyoto (JP); Masaaki Fujisaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 301 days.

(21) Appl. No.: 17/082,088

(22) Filed: Oct. 28, 2020

(65) Prior Publication Data

US 2021/0062800 A1    Mar. 4, 2021

Related U.S. Application Data

(63) Continuation of application No. PCT/JP2019/012666, filed on Mar. 26, 2019.

(30) Foreign Application Priority Data

May 31, 2018 (JP) .............................. JP2018-104273
Jun. 25, 2018 (JP) .............................. JP2018-119430
Jun. 25, 2018 (JP) .............................. JP2018-119431

(51) Int. Cl.
*F04B 43/04* (2006.01)
*F04B 49/22* (2006.01)
(Continued)

(52) U.S. Cl.
CPC ............ *F04B 43/04* (2013.01); *F04B 43/046* (2013.01); *F04B 49/22* (2013.01); *F16K 7/17* (2013.01);
(Continued)

(58) Field of Classification Search
CPC .......... F04B 43/46; F04B 49/22; F04B 43/04; F16K 7/17; F16K 15/14; F16K 31/02; H01L 41/0973
See application file for complete search history.

(56) References Cited

U.S. PATENT DOCUMENTS 6,682,500 B2 * 1/2004 Soltanpour ....... A61M 5/14593
604/9
8,123,502 B2 * 2/2012 Blakey .................. F04B 45/047
92/96
(Continued)

FOREIGN PATENT DOCUMENTS

JP    2004-353638 A    12/2004
JP    2009-074418 A     4/2009
(Continued)

OTHER PUBLICATIONS

International Search Report for PCT/JP2019/012666 dated Jun. 25, 2019.
Written Opinion for PCT/JP2019/012666 dated Jun. 25, 2019.

*Primary Examiner* — Connor J Tremarche
(74) *Attorney, Agent, or Firm* — Pearne & Gordon LLP (57) ABSTRACT

A pump (10) includes: a flat plate (20); a piezoelectric element (21); a flat plate (30); a side wall (40); a support member (22); a support member (32); a shielding plate (500); a ventilation hole (23); a ventilation hole (33); a film valve (61); and a film valve (62). The film valve (61) is arranged in a region where the flat plate (20) and the shielding plate (500) face each other. The film valve (62) is arranged in a region where the flat plate (30) and the shielding plate (500) face each other. A center side of one of the film valve (61) and the film valve (62) is fixed in a state in which an outer edge side is movable, and the outer edge side of the other is fixed in a state in which the center side is movable.

20 Claims, 5 Drawing Sheets

(51) Int. Cl.
*H01L 41/09* (2006.01)
*F16K 7/17* (2006.01)
*F16K 15/14* (2006.01)
*F16K 31/02* (2006.01)
*F04B 43/14* (2006.01)

(52) U.S. Cl.
CPC .......... *F16K 15/14* (2013.01); *H01L 41/0973* (2013.01); *F04B 43/14* (2013.01); *F16K 31/02* (2013.01)

(56) References Cited

U.S. PATENT DOCUMENTS

| | | |
|---|---|---|
| 2009/0015097 A1* | 1/2009 | Meng ........................ H02N 2/14 318/116 |
| 2015/0023821 A1 | 1/2015 | Campbell et al. |
| 2016/0010636 A1 | 1/2016 | Tanaka et al. |
| 2018/0187672 A1* | 7/2018 | Tanaka .................... F04B 43/02 |

FOREIGN PATENT DOCUMENTS

| | | |
|---|---|---|
| WO | 2014/148103 A1 | 9/2014 |
| WO | 2016/013390 A1 | 1/2016 |

* cited by examiner

PUMP

This is a continuation of International Application No. PCT/JP2019/012666 filed on Mar. 26, 2019 which claims priority from Japanese Patent Application No. 2018-104273 filed on May 31, 2018, and claims priority from Japanese Patent Application No. 2018-119430 filed on Jun. 25, 2018, and claims priority from Japanese Patent Application No. 2018-119431 filed on Jun. 25, 2018. The contents of these applications are incorporated herein by reference in their entireties.

BACKGROUND OF THE DISCLOSURE

Field of the Disclosure

The present disclosure relates to a pump using a piezoelectric body.

Description of the Related Art

Various types of existing pumps for transporting a fluid by using a piezoelectric body have been proposed as disclosed in Patent Document 1 and the like.

In the pump disclosed in Patent Document 1, a vibration plate is arranged at the center of a pump chamber. Furthermore, in the pump disclosed in Patent Document 1, a first pump chamber (upper pump chamber) and a second pump chamber (lower pump chamber), which are formed by isolating the pump chamber by the vibration plate, each include a suction port and a discharge port. Check valves for preventing backflow are installed in the respective discharge ports, and flow straightening is achieved by these check valves.

Patent Document 1: U.S. Publication Patent No. 2015-0023821 specification

BRIEF SUMMARY OF THE DISCLOSURE

However, in the pump disclosed in Patent Document 1, since one discharge port is arranged at the center of each pump chamber and the check valve is arranged at the discharge port, the flow path resistance is increased. This causes the decrease in flow rate, and excellent pump characteristics cannot be achieved.

Accordingly, an object of the present disclosure is to provide a pump having a flow straightening function and having excellent pump characteristics.

A pump according to this disclosure includes: a first flat plate; a second flat plate; a side wall; a first support member; a second support member; a first shielding plate; a first ventilation hole; a second ventilation hole; a first valve body; and a second valve body. The first flat plate has one main surface and another main surface facing each other. The second flat plate has one main surface facing the one main surface of the first flat plate. A piezoelectric element is arranged on the first flat plate or the second flat plate. The side wall is arranged on an outer side relative to outer edges of the first flat plate and the second flat plate. The first support member supports the outer edge of the first flat plate and the side wall such that the first flat plate is capable of vibrating. The second support member supports the outer edge of the second flat plate and the side wall such that the second flat plate is capable of vibrating. The first shielding plate is arranged between the first flat plate and the second flat plate, faces the first flat plate and the second flat plate at the outer edges of the first flat plate and the second flat plate, has an opening at a center, and is fixed to the side wall. The first ventilation hole is formed between the outer edge of the first flat plate and the side wall. The second ventilation hole is formed between the outer edge of the second flat plate and the side wall. The first valve body is arranged in a region where the first flat plate and the first shielding plate face each other. The second valve body is arranged in a region where the second flat plate and the first shielding plate face each other. A center side of one of the first valve body and the second valve body is fixed in a state in which an outer edge side is movable, and the outer edge side of the other is fixed in a state in which the center side is movable.

According to this configuration, by the vibration of the first flat plate caused by the piezoelectric element and the vibration of the second flat plate caused by the vibration of the first flat plate, when the first valve body opens the section between the center side and the outer edge side, the second valve body closes the section between the center side and the outer edge side. Conversely, when the first valve body closes the section between the center side and the outer edge side, the second valve body opens the section between the center side and the outer edge side. For example, when a fluid is sucked from the outer edge of the first flat plate, the first valve body opens the section between the center side and the outer edge side, and the second valve body closes the section between the center side and the outer edge side. With this configuration, the leakage of the fluid from the outer edge of the second flat plate when suctioning is suppressed. On the other hand, when a fluid is discharged from the outer edge of the second flat plate, the second valve body opens the section between the center side and the outer edge side, and the first valve body closes the section between the center side and the outer edge side. With this configuration, the leakage due to backflow of the fluid to the outer edge of the first flat plate when discharging is suppressed.

In the pump according to this disclosure, it is preferable that the outer edge of the first flat plate be supported by the first support member such that the first flat plate is capable of vibrating.

According to this configuration, the attenuation of the vibration of the first flat plate is suppressed.

Furthermore, it is preferable that the pump according to this disclosure have the following configurations. A distance between the first flat plate and the first shielding plate in the region where the first flat plate and the first shielding plate face each other is smaller than a distance between the first support member and the first shielding plate. A distance between the second flat plate and the first shielding plate in the region where the second flat plate and the first shielding plate face each other is smaller than a distance between the second support member and the first shielding plate.

According to this configuration, since the height of the forming portion of each of the first valve body and the second valve body of the flow path is lower than the height of the other portion of the flow path, the first valve body and the second valve body close the flow path with ease, and the flow straightening efficiency is enhanced.

Furthermore, it is preferable that the pump according to this disclosure have the following configurations. The pump includes: a third flat plate; a third support member; a second shielding plate; a third ventilation hole; a third valve body; and a fourth valve body. The third flat plate is arranged on a side of the other main surface of the first flat plate, and has one main surface facing the other main surface. The third support member supports an outer edge of the third flat plate and the side wall such that the third flat plate is capable of vibrating. The second shielding plate is arranged between the first flat plate and the third flat plate, faces the first flat plate and the third flat plate at the outer edges, has an opening at a center, and is fixed to the side wall. The third ventilation hole is formed between the outer edge of the third flat plate and the side wall. The third valve body is arranged in a region where the first flat plate and the second shielding plate face each other. The fourth valve body is arranged in a region where the third flat plate and the second shielding plate face each other. A center side of one of the third valve body and the fourth valve body is fixed in a state in which an outer edge side is movable, and the outer edge side of the other is fixed in a state in which the center side is movable. The first valve body and the third valve body are in a reversely positional relationship between a fixed portion and a movable portion.

According to this configuration, the flow straightening portion by the valve bodies connected in series between the suction port and the discharge port increases, and the pressure increases.

Furthermore, in the pump according to this disclosure, it is preferable that piezoelectric elements be arranged on both main surfaces of the first flat plate or the second flat plate.

According to this configuration, the vibration efficiency is improved, and the pressure and the flow rate are improved.

Furthermore, in the pump according to this disclosure, it is preferable that piezoelectric elements be arranged on the first flat plate and the second flat plate.

According to this configuration, the vibration efficiency is improved, and the pressure and the flow rate are improved.

Furthermore, in the pump according to this disclosure, it is preferable that piezoelectric elements be arranged on all the first flat plate, the second flat plate, and the third flat plate.

According to this configuration, the vibration efficiency is further improved, and the pressure and the flow rate are further improved.

Furthermore, it is preferable that the pump according to this disclosure include: a fourth flat plate; a fourth support member; a third shielding plate; a fourth ventilation hole; a fifth valve body; and a sixth valve body. The fourth flat plate is arranged on a side of another main surface of the second flat plate, and has one main surface facing the other main surface. The fourth support member supports an outer edge of the fourth flat plate and the side wall. The third shielding plate is arranged between the second flat plate and the fourth flat plate, faces the second flat plate and the fourth flat plate at the outer edges, further has an opening at a center, and is fixed to the side wall. The fourth ventilation hole is formed between the outer edge of the fourth flat plate and the side wall. The fifth valve body is arranged in a region where the second flat plate and the third shielding plate face each other. The sixth valve body is arranged in a region where the fourth flat plate and the third shielding plate face each other.

A center side of one of the fifth valve body and the sixth valve body is fixed in a state in which an outer edge side is movable, and the outer edge side of the other is fixed in a state in which the center side is movable. The second valve body and the fifth valve body are in a reversely positional relationship between a fixed portion and a movable portion.

According to this configuration, the pressure and the flow rate as the pump are improved.

Furthermore, in the pump according to this disclosure, it is preferable that the outer edge of the fourth flat plate be supported by the fourth support member such that the fourth flat plate is capable of vibrating.

According to this configuration, the attenuation of the vibration of the fourth flat plate is suppressed.

Furthermore, it is preferable that the pump according to this disclosure have the following configurations. The first support member and the second support member are each formed of a plurality of belt-shaped members each having a bent portion. The first ventilation hole is formed by gaps between the plurality of belt-shaped members of the first support member. The second ventilation hole is formed by gaps between the plurality of belt-shaped members of the second support member.

According to this configuration, the effect of confining the vibration of the flat plate is improved, and the displacement of the vibration of the flat plate is increased. This improves the pump performance.

Furthermore, in the pump according to this disclosure, it is preferable that the first support member be thinner than the first flat plate.

According to this configuration, the attenuation of the vibration of the first flat plate caused by the first support member is suppressed.

Furthermore, in the pump according to this disclosure, it is preferable that the first support member be made of a material having a Young's modulus lower than that of the first flat plate.

According to this configuration, the attenuation of the vibration of the first flat plate caused by the first support member is suppressed.

According to this disclosure, it is possible to achieve excellent pump characteristics.

DETAILED DESCRIPTION OF THE DISCLOSURE

Figure 1:
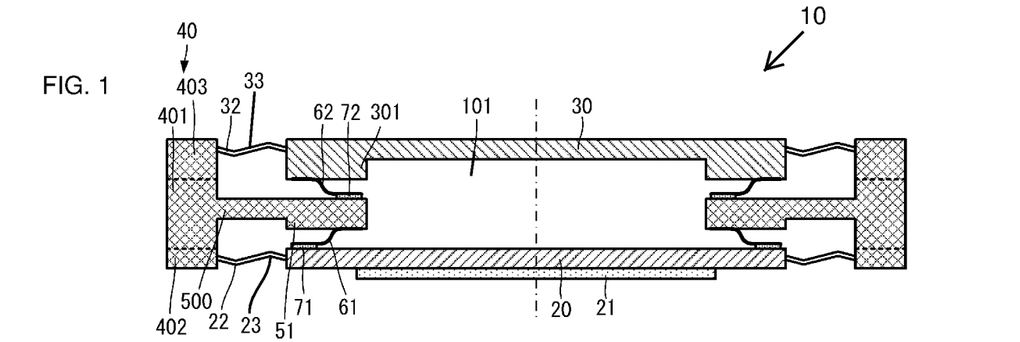
FIG. 1 is a cross-sectional view illustrating the configuration of a pump 10 according to a first embodiment of the present disclosure.

A pump according to a first embodiment of the present disclosure will be described with reference to the drawings. FIG. 1 is a cross-sectional view illustrating the configuration of a pump 10 according to the first embodiment of the present disclosure. Note that in each of the drawings illustrated in the following embodiments, for ease of understanding the description, the shape of each constituent element is partially or entirely illustrated in an exaggerated manner.

As illustrated in FIG. 1, the pump 10 includes a flat plate 20, a piezoelectric element 21, a support member 22, a ventilation hole 23, a flat plate 30, a support member 32, a ventilation hole 33, a side wall 40, a shielding plate 500, a film valve 61, a film valve 62, a bonding member 71, and a bonding member 72. The flat plate 20 corresponds to a "first flat plate" of the present disclosure, and the flat plate 30 corresponds to a "second flat plate" of the present disclosure. The support member 22 corresponds to a "first support member" of the present disclosure, and the support member 32 corresponds to a "second support member" of the present disclosure. The ventilation hole 23 corresponds to a "first ventilation hole" of the present disclosure, and the ventilation hole 33 corresponds to a "second ventilation hole" of the present disclosure. The film valve 61 corresponds to a "first valve body" of the present disclosure, and the film valve 62 corresponds to a "second valve body" of the present disclosure. The shielding plate 500 corresponds to a "first shielding plate" of the present disclosure.

The flat plate 20 is a circular plate having one main surface and the other main surface facing each other. The flat plate 20 is formed of a material and a size that enable bending vibration. The bending vibration is vibration which takes a direction perpendicular to the plate-shaped member surface as a vibration direction. Furthermore, the flat plate 20 is formed of a material and a size that allow vibration at a predetermined resonant frequency.

For an outer edge of the flat plate 20, a cylindrical side wall member 402 is arranged so as to be spaced apart from the outer edge of the flat plate 20. The support member 22 is arranged between the outer edge of the flat plate 20 and the side wall member 402.

The support member 22 is arranged over the entire circumference of the outer edge of the flat plate 20. The support member 22 is connected to the outer edge of the flat plate 20 and the side wall member 402. It is preferable that the flat plate 20, the support member 22, and the side wall member 402 be integrally formed.

The support member 22 is formed of a plurality of belt-shaped members each having a bent portion. The plurality of belt-shaped members has spaced regions, and the spaced regions serve as the ventilation hole 23.

The flat plate 30 is arranged on the one main surface side of the flat plate 20, and is spaced apart from the flat plate 20. The flat plate 30 has one main surface facing the one main surface of the flat plate 20. The flat plate 30 is a circular plate, and has substantially the same area as that of the flat plate 20. The flat plate 30 is also formed of a material and a size that enable bending vibration. The flat plate 30 is formed of a material and a size that allow vibration at the same resonant frequency as that of the flat plate 20.

The flat plate 30 has a thick portion 301 in an outer edge region. The thick portion 301 has a ring shape.

For an outer edge of the flat plate 30, a cylindrical side wall member 403 is arranged so as to be spaced apart from the outer edge of the flat plate 30. The support member 32 is arranged between the outer edge of the flat plate 30 and the side wall member 403.

The support member 32 is arranged over the entire circumference of the outer edge of the flat plate 30. The support member 32 is connected to the outer edge of the flat plate 30 and the side wall member 403. It is preferable that the flat plate 30, the support member 32, and the side wall member 403 be integrally formed.

The support member 32 is formed of a plurality of belt-shaped members each having a bent portion. The plurality of belt-shaped members has spaced regions, and the spaced regions serve as the ventilation hole 33.

The piezoelectric element 21 is arranged on the other main surface of the flat plate 20.

The shielding plate 500 has a ring shape. In other words, the shielding plate 500 is a circular plate having an opening at the center thereof. The shielding plate 500 is made of a material having high rigidity that makes almost no bending vibration or does not make bending vibration.

The shielding plate 500 is arranged between the flat plate 20 and the flat plate 30. A region on an inner edge side of the shielding plate 500 faces the flat plate 20 and the flat plate 30. The shielding plate 500 has a thick portion 51 in the region on the inner side. The thick portion 51 has a ring shape, and substantially overlaps with the region facing the flat plate 20 and the flat plate 30.

An outer edge of the shielding plate 500 is connected to a cylindrical side wall member 401. At this time, the shielding plate 500 is fixed with high rigidity so as to be capable of suppressing the occurrence of the above-described bending vibration.

The bottom surface of the side wall member 401 abuts on and is bonded to the top surface of the side wall member 402. The top surface of the side wall member 401 abuts on and is bonded to the bottom surface of the side wall member 403. The side wall 40 is formed of the side wall member 401, the side wall member 402, and the side wall member 403.

The film valve 61 and the film valve 62 are made of a material having flexibility. The film valve 61 and the film valve 62 are realized by a lightweight and low-rigidity material. For example, the film valve 61 and the film valve 62 are realized by a resin film such as polyimide, liquid crystal polymer, PET, or the like, a metal foil, or the like. Note that it is more preferable that the film valve 61 and the film valve 62 be made of a resin film. The film valve 61 and the film valve 62 each have a ring shape.

The film valve 61 is arranged in a region where the flat plate 20 and the shielding plate 500 overlap with each other. The film valve 61 is bonded to the one main surface of the flat plate 20 (the surface on the opposite side of the surface on which the piezoelectric element 21 is arranged) by using the bonding member 71 having a ring shape. More specifically, a portion having a predetermined width on an outer end side of the ring shape of the film valve 61 is bonded to the flat plate 20 by the bonding member 71, and a region on an inner end side is not bonded. With this configuration, the film valve 61 is bonded to the flat plate 20 in a state in which a region having a predetermined area on the inner end side can vibrate.

It is preferable that the length of the film valve 61 in the radial direction be longer than the distance (the height of a first flow straightening function portion) between the flat plate 20 and the shielding plate 500, except for the region to be bonded to the bonding member 71.

The film valve 62 is arranged in a region where the flat plate 30 and the shielding plate 500 overlap with each other. The film valve 62 is bonded to a surface of the shielding plate 500 facing the flat plate 30 by using the bonding member 72 having a ring shape. More specifically, a portion having a predetermined width on an inner end side of the ring shape of the film valve 62 is bonded to the shielding plate 500 by the bonding member 72, and a region on an outer end side is not bonded. With this configuration, the film valve 62 is bonded to the shielding plate 500 in a state in which a region having a predetermined area on the outer end side can vibrate.

It is preferable that the length of the film valve 62 in the radial direction be longer than the distance (the height of a second flow straightening function portion) between the flat plate 30 and the shielding plate 500, except for the region to be bonded to the bonding member 72.

With the configuration as described above, the pump 10 has a pump chamber 101 surrounded by the flat plate 20, the flat plate 30, and the side wall 40. Furthermore, the pump chamber 101 is constituted of a central region, a first outer edge region, and a second outer edge region.

As an example, the flat plate 20 has a thickness of 0.6 mm and a diameter φ of 14 mm. The piezoelectric element 21 has a thickness of 0.15 mm and a diameter of 10.6 mm. A boundary portion between the bonded region and the region that can vibrate of each of the film valves 61 and 62 can be provided at a position of 6.5 mm from the center of the pump chamber 101. At this time, the flat plate 20 vibrates at a frequency of 29.4 kHz.

The central region is a region surrounded by the flat plate 20, the flat plate 30, the shielding plate 500, the film valve 61, and the film valve 62. The first outer edge region is surrounded by the film valve 61, the support member 22, the side wall 40, and the shielding plate 500, and is a region located on an outer side relative to the film valve 61. The second outer edge region is surrounded by the film valve 62, the support member 32, the side wall 40, and the shielding plate 500, and is a region located on an outer side relative to the film valve 62.

In other words, the central region and the first outer edge region communicate with each other with the first flow straightening function portion having the film valve 61 interposed therebetween, and the central region and the second outer edge region communicate with each other with the second flow straightening function portion having the film valve 62 interposed therebetween.

The first outer edge region communicates with the outside of the pump 10 on the flat plate 20 side through the ventilation hole 23. The second outer edge region communicates with the outside of the pump 10 on the flat plate 30 side through the ventilation hole 33.

Figure 2A:
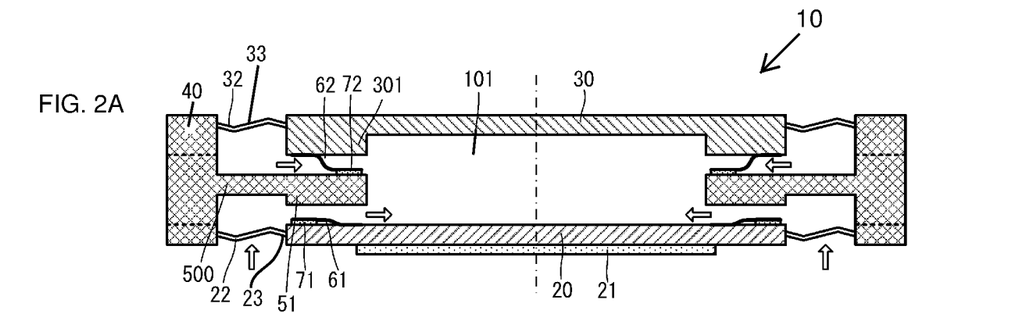
FIG. 2A is cross-sectional view illustrating behavior of the pump 10 when suctioning.
Figure 2B:
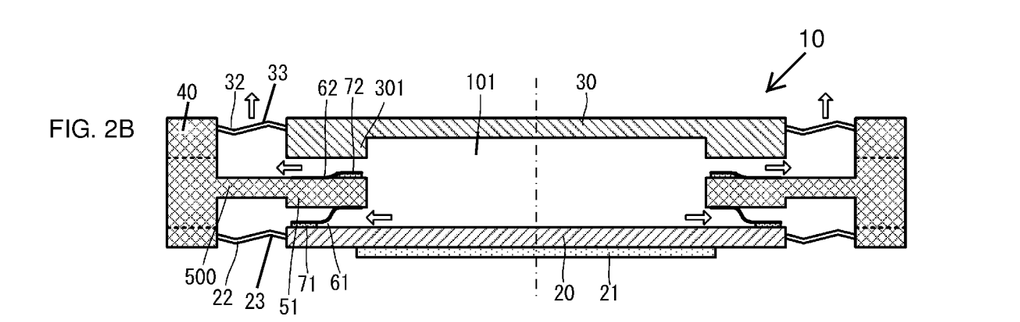
FIG. 2B is a cross-sectional view illustrating behavior of the pump 10 when discharging.

According to the configuration as described above, the pump 10 operates as described below. FIG. 2A is a cross-sectional view illustrating behavior of the pump 10 according to the first embodiment when suctioning, and FIG. 2B is a cross-sectional view illustrating behavior of the pump 10 when discharging.

(When Suctioning) When the flat plate 20 and the flat plate 30 vibrate and a fluid is sucked through the ventilation hole 23 as illustrated in FIG. 2A, the pressure on the central region side of the film valve 61 becomes lower than the pressure on the first outer edge region side of the film valve 61. In other words, the pressure on the first outer edge region side of the film valve 61 becomes higher than the pressure on the central region side of the film valve 61.

With this, the inner end of the film valve 61 bends toward the flat plate 20 side, and abuts on the one main surface of the flat plate 20, for example. As a result, the section between the first outer edge region and the central region is opened. Accordingly, the flow path resistance of the first flow straightening function portion having the film valve 61 decreases, and the fluid sucked into the first outer edge region through the ventilation hole 23 flows smoothly from the first outer edge region into the central region.

On the other hand, when the fluid is sucked through the ventilation hole 23 as illustrated in FIG. 2A, the pressure on the central region side of the film valve 62 becomes higher than the pressure on the second outer edge region side of the film valve 62. In other words, the pressure on the second outer edge region side of the film valve 62 becomes lower than the pressure on the central region side of the film valve 62.

With this, the outer end of the film valve 62 bends toward the flat plate 30 side, and abuts on the one main surface of the flat plate 30, for example. As a result, the section between the second outer edge region and the central region is closed. Accordingly, the flow path resistance of the second flow straightening function portion having the film valve 62 significantly increases, and the backflow of the fluid from the second outer edge region into the central region is suppressed.

(When Discharging) When the flat plate 20 and the flat plate 30 vibrate and a fluid is discharged through the ventilation hole 33 as illustrated in FIG. 2B, the pressure on the central region side of the film valve 62 becomes higher than the pressure on the second outer edge region side of the film valve 62. In other words, the pressure on the second outer edge region side of the film valve 62 becomes lower than the pressure on the central region side of the film valve 62.

With this, the outer end of the film valve 62 bends toward the shielding plate 500 side, and abuts on the main surface of the shielding plate 500, for example. As a result, the section between the second outer edge region and the central region is opened (the regions are communicated). Accordingly, the flow path resistance of the second flow straightening function portion having the film valve 62 decreases, and the fluid flows from the central region into the second outer edge region and is discharged through the ventilation hole 33 to the outside.

On the other hand, when the fluid is discharged through the ventilation hole 33 as illustrated in FIG. 2B, the pressure on the central region side of the film valve 61 becomes higher than the pressure on the first outer edge region side of the film valve 61. In other words, the pressure on the first outer edge region side of the film valve 61 becomes lower than the pressure on the central region side of the film valve 61.

With this, the inner end of the film valve 61 bends toward the shielding plate 500 side, and abuts on the main surface of the shielding plate 500, for example. As a result, the section between the first outer edge region and the central region is closed. Accordingly, the flow path resistance of the first flow straightening function portion having the film valve 61 significantly increases, and the backflow of the fluid from the central region into the first outer edge region is suppressed.

According to the configuration as described above, the backflow when suctioning the fluid and when discharging the fluid is suppressed. This improves the flow straightening efficiency and improves the flow rate and the pressure. That is, the pump characteristics of the pump 10 are improved.

Furthermore, in the present embodiment, since the shielding plate 500 has the thick portion 51, the height (the distance between the flat plate 20 and the shielding plate 500) of the first flow straightening function portion having the film valve 61 is lower than the height of the other portion such as the first outer edge region. With this, when the first flow straightening function portion is closed, the film valve 61 abuts on the shielding plate 500 with ease. Furthermore, since the flat plate 30 has the thick portion 301, the height (the distance between the flat plate 30 and the shielding plate 500) of the second flow straightening function portion having the film valve 62 is lower than the height of the other portion such as the second outer edge region. With this, when the second flow straightening function portion is closed, the film valve 62 abuts on the flat plate 30 with ease. Accordingly, the flow straightening efficiency is further improved, and the pump characteristics of the pump 10 are further improved.

Note that in the present embodiment, the mode in which the film valve 61 is bonded to the flat plate 20 has been described, but it may be bonded to the surface of the shielding plate 500 facing the flat plate 20. Furthermore, the mode in which the film valve 62 is bonded to the shielding plate 500 has been described, but it may be bonded to the surface of the flat plate 30 facing the shielding plate 500.

Figure 3:
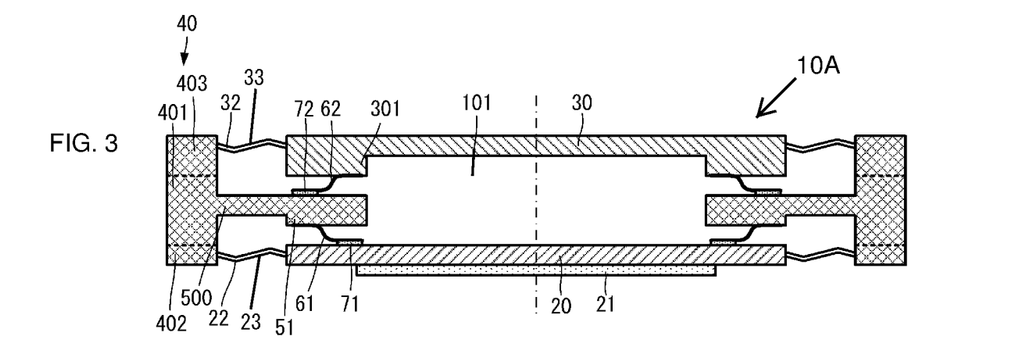
FIG. 3 is a cross-sectional view illustrating the configuration of a pump 10A according to a second embodiment of the present disclosure.
Figure 4A:
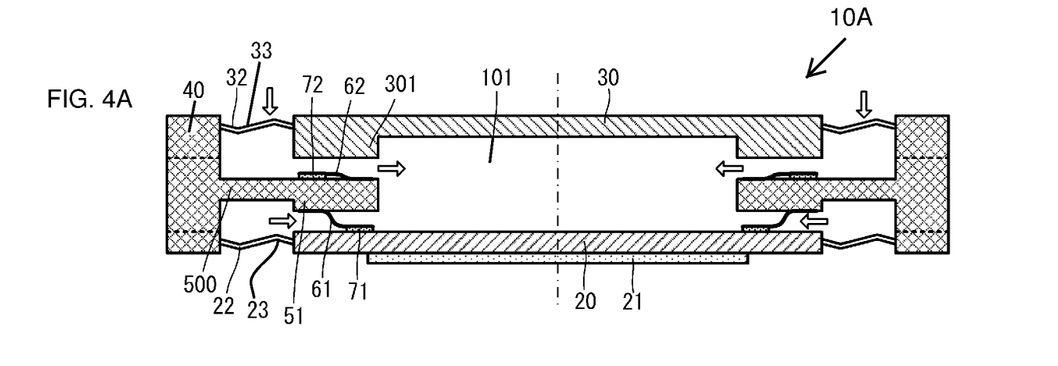
FIG. 4A is a cross-sectional view illustrating behavior of the pump 10A according to the second embodiment when suctioning.
Figure 4B:
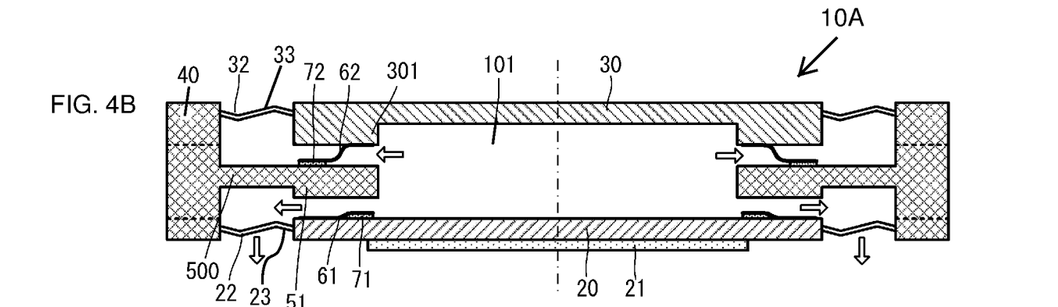
FIG. 4B is a cross-sectional view illustrating behavior of the pump 10A when discharging.

Next, a pump according to a second embodiment of the present disclosure will be described with reference to the drawings. FIG. 3 is a cross-sectional view illustrating the configuration of a pump 10A according to the second embodiment of the present disclosure. FIG. 4A is a cross-sectional view illustrating behavior of the pump 10A according to the second embodiment when suctioning, and FIG. 4B is a cross-sectional view illustrating behavior of the pump 10A when discharging.

As illustrated in FIG. 3, the pump 10A according to the second embodiment is different from the pump 10 according to the first embodiment in a point that the bonding direction of the film valve 61 and the film valve 62 is opposite thereto. The other configuration of the pump 10A is similar to that of the pump 10, and the description of the similar configuration will be omitted.

A portion having a predetermined width on an inner end side of the film valve 61 is bonded to the flat plate 20 by the bonding member 71, and a region on an outer end side is not bonded. With this configuration, the film valve 61 is bonded to the flat plate 20 in a state in which a region having a predetermined area on the outer end side can vibrate.

A portion having a predetermined width on an outer end side of the film valve 62 is bonded to the shielding plate 500 by the bonding member 72, and a region on an inner end side is not bonded. With this configuration, the film valve 62 is bonded to the shielding plate 500 in a state in which a region having a predetermined area on the inner end side can vibrate.

According to the configuration as described above, the pump 10A operates as described below.

(When Suctioning)

As illustrated in FIG. 4A, when the flat plate 20 and the flat plate 30 vibrate and a fluid is sucked through the ventilation hole 33, the pressure on the central region side of the film valve 62 becomes lower than the pressure on the second outer edge region side of the film valve 62. In other words, the pressure on the second outer edge region side of the film valve 62 becomes higher than the pressure on the central region side of the film valve 62.

With this, the inner end of the film valve 62 bends toward the shielding plate 500 side, and abuts on the main surface of the shielding plate 500, for example. As a result, the section between the second outer edge region and the central region is opened (the regions are communicated). Accordingly, the flow path resistance of the second flow straightening function portion having the film valve 62 decreases, and the fluid sucked into the second outer edge region through the ventilation hole 33 flows smoothly from the second outer edge region into the central region.

On the other hand, when the fluid is sucked through the ventilation hole 33 as illustrated in FIG. 4A, the pressure on the central region side of the film valve 61 becomes lower than the pressure on the first outer edge region side of the film valve 61. In other words, the pressure on the first outer edge region side of the film valve 61 becomes higher than the pressure on the central region side of the film valve 61.

With this, the outer end of the film valve 61 bends toward the shielding plate 500 side, and abuts on the main surface of the shielding plate 500, for example. As a result, the section between the first outer edge region and the central region is closed. Accordingly, the flow path resistance of the first flow straightening function portion having the film valve 61 significantly increases, and the backflow of the fluid from the first outer edge region into the central region is suppressed.

(When Discharging)

As illustrated in FIG. 4B, when the flat plate 20 and the flat plate 30 vibrate and a fluid is discharged through the ventilation hole 23, the pressure on the central region side of the film valve 61 becomes higher than the pressure on the first outer edge region side of the film valve 61. In other words, the pressure on the first outer edge region side of the film valve 61 becomes lower than the pressure on the central region side of the film valve 61.

With this, the outer end of the film valve 61 bends toward the flat plate 20 side, and abuts on the one main surface of the flat plate 20, for example. As a result, the section between the first outer edge region and the central region is opened. Accordingly, the flow path resistance of the first flow straightening function portion having the film valve 61 decreases, and the fluid flows from the central region into the first outer edge region and is discharged through the ventilation hole 23 to the outside.

On the other hand, when the fluid is discharged through the ventilation hole 23 as illustrated in FIG. 4B, the pressure on the central region side of the film valve 62 becomes higher than the pressure on the second outer edge region side of the film valve 62. In other words, the pressure on the second outer edge region side of the film valve 62 becomes lower than the pressure on the central region side of the film valve 62.

With this, the inner end of the film valve 62 bends toward the flat plate 30 side, and abuts on the one main surface of the flat plate 30, for example. As a result, the section between the second outer edge region and the central region is closed. Accordingly, the flow path resistance of the second flow straightening function portion having the film valve 62 significantly increases, and the backflow of the fluid from the central region into the second outer edge region is suppressed.

Figure 5:
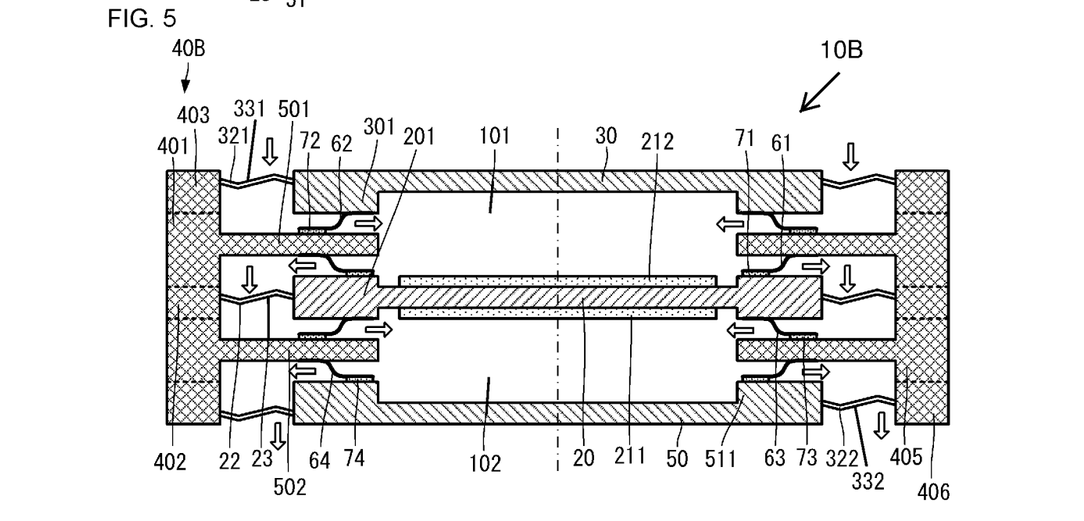
FIG. 5 is a cross-sectional view illustrating the configuration of a pump 10B according to a third embodiment of the present disclosure.

Next, a pump according to a third embodiment of the present disclosure will be described with reference to the drawings. FIG. 5 is a cross-sectional view illustrating the configuration of a pump 10B according to the third embodiment of the present disclosure.

As illustrated in FIG. 5, the pump 10B according to the third embodiment is different from the pump 10A according to the second embodiment in a point that the pump chamber is constituted of two stages. Part of the structure of the pump 10B is similar to that of the pump 10A, and the description of the similar structure will be omitted. Note that a shielding plate 501 of the pump 10B is similar to the shielding plate 500 of the pump 10A. Furthermore, a support member 321 is similar to the support member 32, and a ventilation hole 331 is similar to the ventilation hole 33.

The pump 10B includes a flat plate 50, a film valve 63, a film valve 64, a bonding member 73, a bonding member 74, a piezoelectric element 211, a piezoelectric element 212, a support member 322, a ventilation hole 332, a side wall member 405, a side wall member 406, and a shielding plate 502. The flat plate 50 corresponds to a "third flat plate" of the present disclosure, and the shielding plate 502 corresponds to a "second shielding plate" of the present disclosure. The film valve 63 corresponds to a "third valve body" of the present disclosure, and the film valve 64 corresponds to a "fourth valve body" of the present disclosure. The support member 322 corresponds to a "third support member" of the present disclosure. The ventilation hole 332 corresponds to a "third ventilation hole" of the present disclosure.

The flat plate 20 has a thick portion 201 in an outer edge region. The thick portion 201 has a ring shape.

The piezoelectric element 211 and the piezoelectric element 212 are similar to the piezoelectric element 21. The piezoelectric element 211 is arranged on the other main surface of the flat plate 20, and the piezoelectric element 212 is arranged on the one main surface of the flat plate 20. That is, the piezoelectric elements are respectively arranged on both main surfaces of the flat plate 20. The piezoelectric element 211 and the piezoelectric element 212 are arranged on a thin-thickness portion at the center of the flat plate 20. The piezoelectric element 211 and the piezoelectric element 212 are driven in opposite phases.

The flat plate 50 is arranged on the other main surface side of the flat plate 20, and is spaced apart from the flat plate 20. The flat plate 50 has one main surface facing the other main surface of the flat plate 20. The flat plate 50 is a circular plate, and has substantially the same area as that of the flat plate 20. The flat plate 50 is also formed of a material and a size that enable bending vibration. The flat plate 50 is formed of a material and a size that allow vibration at the same resonant frequency as that of the flat plate 20.

The flat plate 50 has a thick portion 511 in an outer edge region. The thick portion 511 has a ring shape.

For an outer edge of the flat plate 50, the cylindrical side wall member 406 is arranged so as to be spaced apart from the outer edge of the flat plate 50. The support member 322 is arranged between the outer edge of the flat plate 50 and the side wall member 406.

The support member 322 is arranged over the entire circumference of the outer edge of the flat plate 50. The support member 322 is connected to the outer edge of the flat plate 50 and the side wall member 406. It is preferable that the flat plate 50, the support member 322, and the side wall member 406 be integrally formed.

The support member 322 is formed of a plurality of belt-shaped members each having a bent portion. The plurality of belt-shaped members has spaced regions, and the spaced regions serve as the ventilation hole 332.

The shielding plate 502 has a ring shape. In other words, the shielding plate 502 is a circular plate having an opening at the center thereof. The shielding plate 502 is made of a material having high rigidity that makes almost no bending vibration or does not make bending vibration.

The shielding plate 502 is arranged between the flat plate 20 and the flat plate 50. A region on an inner edge side of the shielding plate 502 faces the flat plate 20 and the flat plate 50.

An outer edge of the shielding plate 502 is connected to the cylindrical side wall member 405. At this time, the shielding plate 502 is fixed with high rigidity so as to be capable of suppressing the occurrence of the above-described bending vibration.

The bottom surface of the side wall member 405 abuts on and is bonded to the top surface of the side wall member 406, and the top surface of the side wall member 405 abuts on and is bonded to the bottom surface of the side wall member 402. A side wall 40B is formed of the side wall member 401, the side wall member 402, the side wall member 403, the side wall member 405, and the side wall member 406.

The film valve 63 and the film valve 64 are similar to the film valve 61 and the film valve 62.

The film valve 63 is arranged in a region where the thick portion 201 of the flat plate 20 and the shielding plate 502 overlap with each other. The film valve 63 is bonded to one main surface of the shielding plate 502 by using the bonding member 73 having a ring shape. More specifically, a portion having a predetermined width on an outer end side of the ring shape of the film valve 63 is bonded to the shielding plate 502 by the bonding member 73, and a region on an inner end side is not bonded. With this configuration, the film valve 63 is bonded to the shielding plate 502 in a state in which a region having a predetermined area on the inner end side can vibrate. As described above, the bonding direction (fixed direction) of the film valve 63 is opposite to that of the film valve 61.

It is preferable that the length of the film valve 63 in the radial direction be longer than the distance (the height of a third flow straightening function portion) between the thick portion 201 of the flat plate 20 and the shielding plate 502, except for the region to be bonded to the bonding member 73.

The film valve 64 is arranged in a region where the thick portion 511 of the flat plate 50 and the shielding plate 502 overlap with each other. The film valve 64 is bonded to one main surface of the flat plate 50 by using the bonding member 74 having a ring shape. More specifically, a portion having a predetermined width on an inner end side of the ring shape of the film valve 64 is bonded to the flat plate 50 by the bonding member 74, and a region on an outer end side is not bonded. With this configuration, the film valve 64 is bonded to the flat plate 50 in a state in which a region having a predetermined area on the outer end side can vibrate.

It is preferable that the length of the film valve 64 in the radial direction be longer than the distance (the height of a fourth flow straightening function portion) between the thick portion 511 of the flat plate 50 and the shielding plate 502, except for the region to be bonded to the bonding member 74.

With the configuration as described above, the pump 10B has a pump chamber 102 surrounded by the flat plate 20, the flat plate 50, and the side wall 40B, together with the pump chamber 101 of the pump 10A. Furthermore, the pump chamber 102 is constituted of a central region, a third outer edge region, and a fourth outer edge region.

The central region is a region surrounded by the flat plate 20, the flat plate 50, the shielding plate 502, the film valve 63, and the film valve 64. The third outer edge region is surrounded by the film valve 63, the support member 22, the side wall 40B, and the shielding plate 502, and is a region located on an outer side relative to the film valve 63. The fourth outer edge region is surrounded by the film valve 64, the support member 322, the side wall 40B, and the shielding plate 502, and is a region located on an outer side relative to the film valve 64.

In other words, the central region and the third outer edge region communicate with each other with the third flow straightening function portion having the film valve 63 interposed therebetween, and the central region and the fourth outer edge region communicate with each other with the fourth flow straightening function portion having the film valve 64 interposed therebetween.

The third outer edge region communicates with the first outer edge region through the ventilation hole 23. The fourth outer edge region communicates with the outside of the pump 10B on the flat plate 50 side through the ventilation hole 332.

With the configuration as described above, the pump 10B has a structure in which the configurations of the pump 10A are connected in series. This improves the pressure and the flow rate, and the pump 10B can achieve more excellent pump characteristics.

Furthermore, the pump 10B drives the flat plate 20 in bimorph. Accordingly, the pump 10B has improved driving efficiency, and can achieve more excellent pump characteristics.

Note that the pump 10B has one flat plate that is vibrated by the piezoelectric elements. As a result, the frequency deviation of the vibration caused when arranging piezoelectric elements on a plurality of flat plates does not occur. Accordingly, the pump 10B can achieve stable vibration with ease.

Furthermore, in the pump 10B according to the present embodiment, the mode including the series configuration of two stages has been described, but a series configuration of three or more stages may be used.

Figure 6:
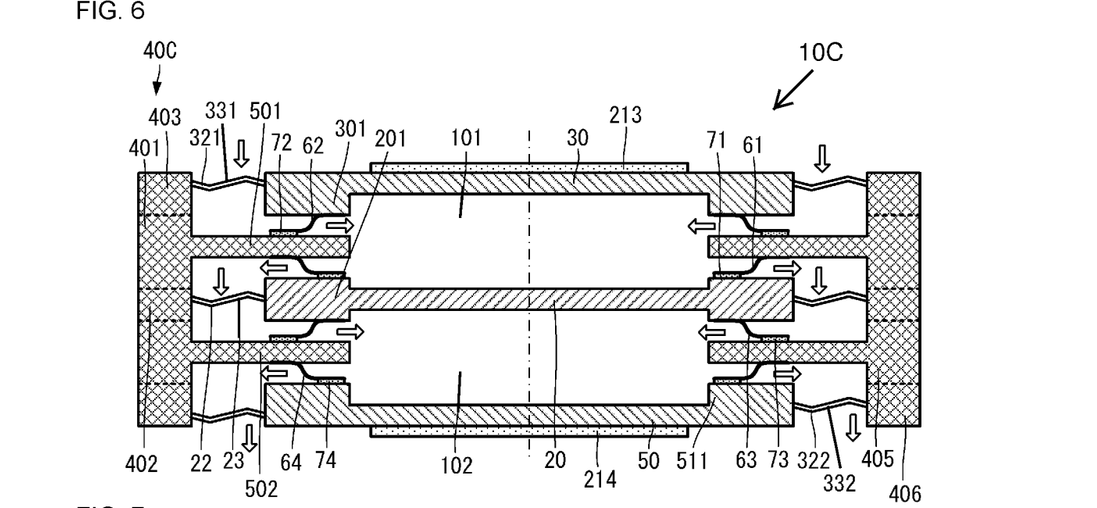
FIG. 6 is a cross-sectional view illustrating the configuration of a pump 10C according to a fourth embodiment of the present disclosure.

Next, a pump according to a fourth embodiment of the present disclosure will be described with reference to the drawings. FIG. 6 is a cross-sectional view illustrating the configuration of a pump 10C according to the fourth embodiment of the present disclosure.

As illustrated in FIG. 6, the pump 10C according to the fourth embodiment is different from the pump 10B according to the third embodiment in a point that a piezoelectric element 213 and a piezoelectric element 214 are arranged instead of the piezoelectric element 211 and the piezoelectric element 212. The other configuration of the pump 10C is similar to that of the pump 10B, and the description of the similar configuration will be omitted. Note that a side wall 40C is similar to the side wall 40B.

The piezoelectric element 213 and the piezoelectric element 214 have configurations similar to those of the piezoelectric element 211 and the piezoelectric element 212. The piezoelectric element 213 is arranged on the other main surface of the flat plate 30. The piezoelectric element 214 is arranged on the other main surface of the flat plate 50. That is, in the configuration illustrated in FIG. 6, the flat plate 30 serves as the "first flat plate", the flat plate 20 serves as the "second flat plate", and the flat plate 50 serves as a "fourth flat plate". Additionally, the film valve 61 and the film valve 62 serve as the "first valve body" and the "second valve body", respectively, and the film valve 63 and the film valve 64 serve as a "fifth valve body" and a "sixth valve body", respectively.

According to the configuration as described above, the pump 10C can achieve pump characteristics similar to those of the pump 10B.

Figure 7:
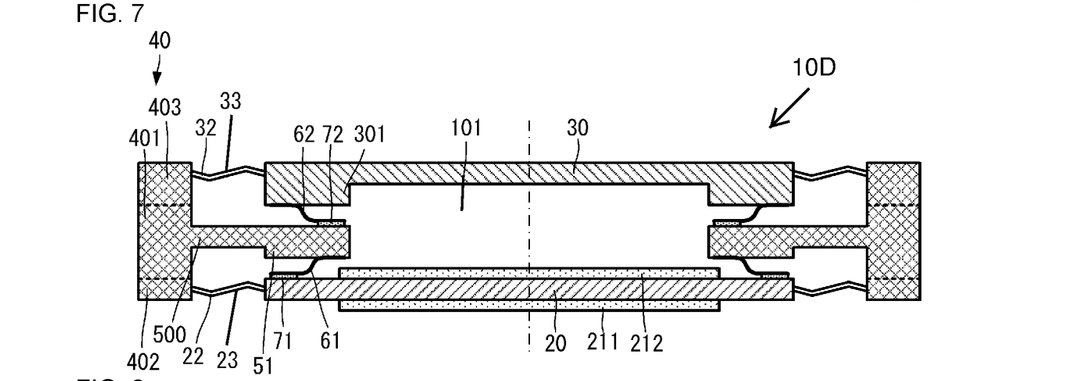
FIG. 7 is a cross-sectional view illustrating the configuration of a pump 10D according to a fifth embodiment of the present disclosure.

Next, a pump according to a fifth embodiment of the present disclosure will be described with reference to the drawings. FIG. 7 is a cross-sectional view illustrating the configuration of a pump 10D according to the fifth embodiment of the present disclosure.

As illustrated in FIG. 7, the pump 10D according to the fifth embodiment is different from the pump 10 according to the first embodiment in a point that the piezoelectric element 212 is added. The other configuration of the pump 10D is similar to that of the pump 10, and the description of the similar configuration will be omitted. Note that the piezoelectric element 211 of the pump 10D is similar to the piezoelectric element 21 of the pump 10.

The piezoelectric element 211 is arranged on the other main surface of the flat plate 20. The piezoelectric element 212 is arranged on the one main surface of the flat plate 20. The piezoelectric element 211 and the piezoelectric element 212 are driven in opposite phases. That is, the flat plate 20 is subjected to bimorph driving.

According to the configuration as described above, the pump 10D can achieve pump characteristics similar to those of the pump 10. Furthermore, the flat plate 20 is subjected to bimorph driving, whereby the driving efficiency is improved, and the pump 10D can achieve more excellent pump characteristics.

Next, a pump according to a sixth embodiment of the present disclosure will be described with reference to the drawings.

Figure 8:
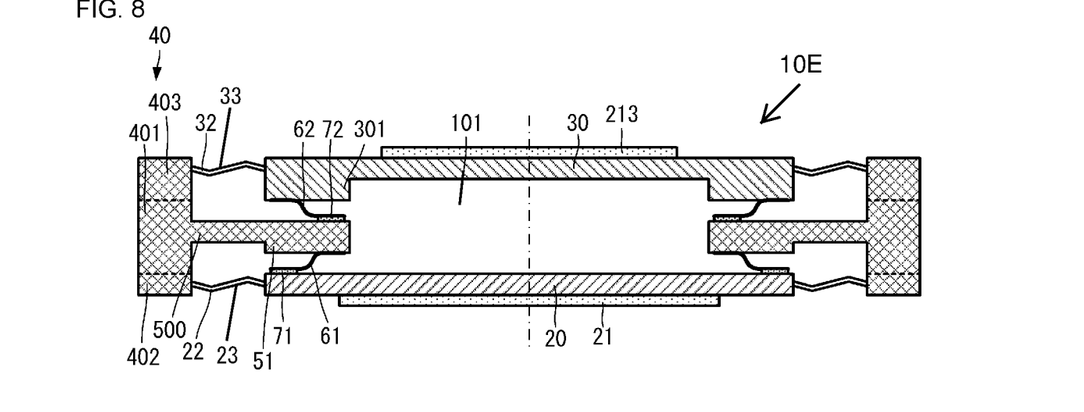
FIG. 8 is a cross-sectional view illustrating the configuration of a pump 10E according to a sixth embodiment of the present disclosure.

FIG. 8 is a cross-sectional view illustrating the configuration of a pump 10E according to the sixth embodiment of the present disclosure.

As illustrated in FIG. 8, the pump 10E according to the sixth embodiment is different from the pump 10 according to the first embodiment in a point that the piezoelectric element 213 is added. The other configuration of the pump 10E is similar to that of the pump 10, and the description of the similar configuration will be omitted.

The piezoelectric element 213 is arranged on the other main surface of the flat plate 30. The piezoelectric element 21 and the piezoelectric element 213 are driven in the same phase. That is, the pump 10E has two active vibration plates that are forcibly driven by the piezoelectric elements.

According to the configuration as described above, the pump 10E can achieve pump characteristics similar to those of the pump 10. Furthermore, by including two vibration plates, the pump 10E can increase the displacement of the pump chamber 101. As a result, the pump 10E can further improve the flow rate and the pressure.

Figure 9:
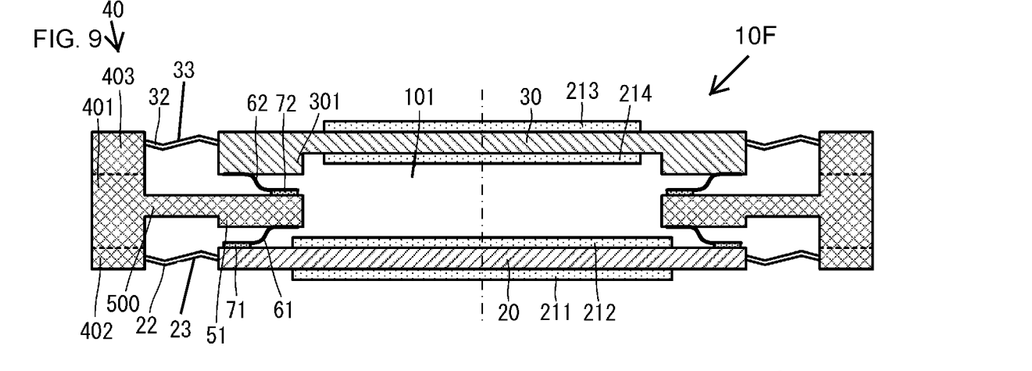
FIG. 9 is a cross-sectional view illustrating the configuration of a pump 10F according to a seventh embodiment of the present disclosure.

Next, a pump according to a seventh embodiment of the present disclosure will be described with reference to the drawings. FIG. 9 is a cross-sectional view illustrating the configuration of a pump 10F according to the seventh embodiment of the present disclosure.

As illustrated in FIG. 9, the pump 10F according to the seventh embodiment is different from the pump 10E according to the sixth embodiment in a point that the piezoelectric element 212 and the piezoelectric element 214 are added. The other configuration of the pump 10F is similar to that of the pump 10E, and the description of the similar configuration will be omitted. The piezoelectric element 211 is similar to the piezoelectric element 21. In other words, the pump 10F has a configuration in which the configuration of the pump 10D and the configuration of the pump 10E are combined.

The piezoelectric element 212 is arranged on the one main surface of the flat plate 20. The piezoelectric element 214 is arranged on the one main surface of the flat plate 30.

According to the configuration as described above, the pump 10F can achieve pump characteristics similar to those of the pump 10E. Furthermore, in the pump 10F, by the two vibration plates being subjected to bimorph driving, the driving efficiency is improved, and pump characteristics are improved.

Figure 10:
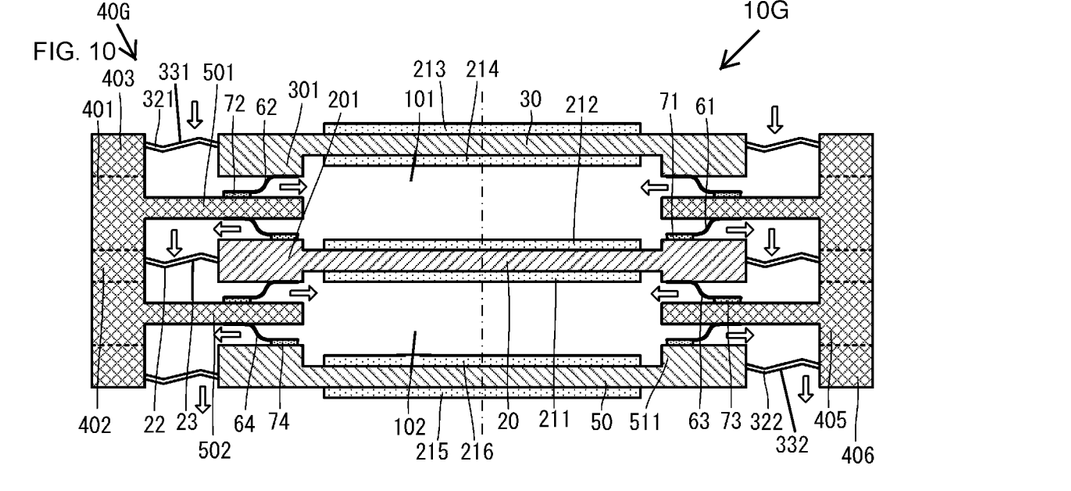
FIG. 10 is a cross-sectional view illustrating the configuration of a pump 10G according to an eighth embodiment of the present disclosure.

Next, a pump according to an eighth embodiment of the present disclosure will be described with reference to the drawings. FIG. 10 is a cross-sectional view illustrating the configuration of a pump 10G according to the eighth embodiment of the present disclosure.

As illustrated in FIG. 10, the pump 10G according to the eighth embodiment is different from the pump 10B according to the third embodiment in a point that the piezoelectric element 213, the piezoelectric element 214, a piezoelectric element 215, and a piezoelectric element 216 are added. The other configuration of the pump 10G is similar to that of the pump 10B, and the description of the similar configuration will be omitted. Note that a side wall 40G is similar to the side wall 40B.

The piezoelectric element 213 is arranged on the other main surface of the flat plate 30. The piezoelectric element 214 is arranged on the one main surface of the flat plate 30.

The piezoelectric element 215 is arranged on the other main surface of the flat plate 50, and the piezoelectric element 216 is arranged on the one main surface of the flat plate 50.

According to the configuration as described above, the pump 10G can achieve pump characteristics similar to those of the pump 10B. Furthermore, in the pump 10G, the piezoelectric elements are arranged on all flat plates, and all flat plates are subjected to bimorph driving. As a result, in the pump 10G, the displacement is increased, the driving efficiency is improved, and the pump characteristics are further improved.

Figure 11:
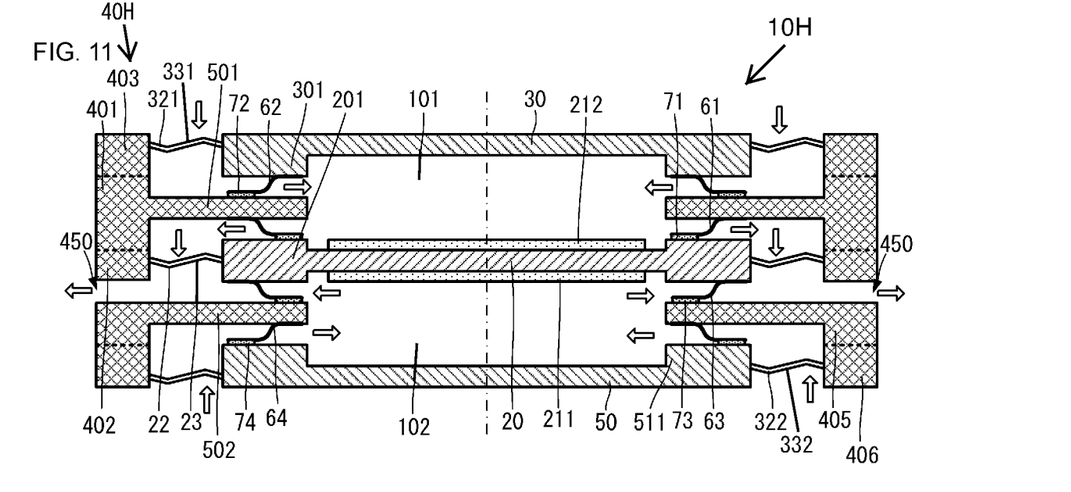
FIG. 11 is a cross-sectional view illustrating the configuration of a pump 10H according to a modification of the third embodiment of the present disclosure.

FIG. 11 is a cross-sectional view illustrating the configuration of a pump 10H according to a modification of the third embodiment of the present disclosure. This pump is different from the pump 10B according to the third embodiment in the structure of the film valves 63 and 64, in the structure of the bonding members 73 and 74, and in a point that a ventilation hole 450 is provided in the side wall member 405. The other configuration of the pump 10H is similar to that of the pump 10B, and the description of the similar configuration will be omitted.

As illustrated in FIG. 11, the film valves 63 and 64 are arranged such that the inside and outside positions of the movable portions are reversed in comparison with the pump 10B illustrated in FIG. 5. With this, the bonding members 73 and 74 are also arranged so as to have a reverse relationship between the inside and outside in comparison with the pump 10B in FIG. 5.

Furthermore, the side wall member 405 includes the ventilation hole 450 for communicating with the outside.

By using the above-described configuration, the pump 10H has a structure in which the pumps 10A are connected in parallel. This improves the pressure and the flow rate of the pump 10H. That is, it is possible to achieve more excellent pump characteristics. Furthermore, in comparison with the pump 10B, the pressure decreases. However, the flow rate is improved.

The ventilation hole 450 may be formed in either the side wall member 402 or the side wall member 406, instead of the side wall member 405. Furthermore, the ventilation holes 450 may be formed in a plurality of members of the side wall members 402, 405, and 406. In particular, when the ventilation hole 450 is formed on the same plane as the thick portion 201, vertical symmetry of the pump 10H at the thick portion 201 is high. As a result, turbulence of an air flow is reduced, and thus the energy loss is reduced.

Note that all of the film valves may be disposed so as to have reverse relationship between the inside and outside. In that case, an air flow in the reverse direction can be generated.

Figure 12:
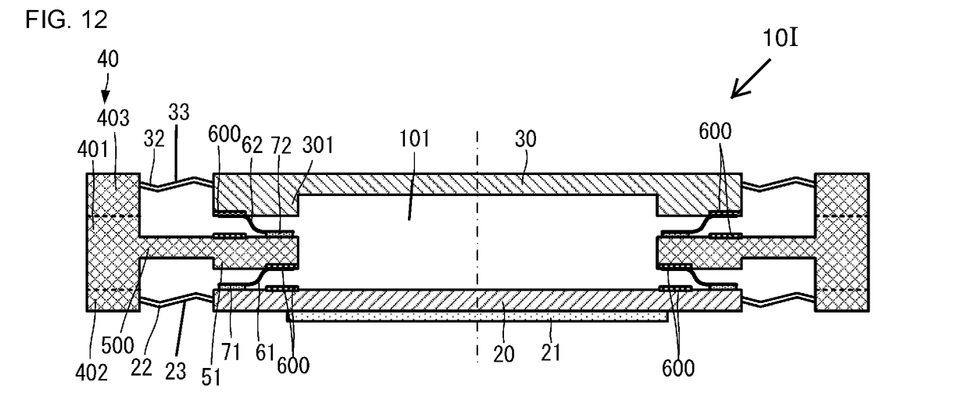
FIG. 12 is a cross-sectional view illustrating the configuration of a pump 10I according to a modification of the first embodiment of the present disclosure.

FIG. 12 is a cross-sectional view illustrating the configuration of a pump 10I according to a modification of the first embodiment of the present disclosure. This pump is different from the pump 10 according to the first embodiment in a point that coating agents 600 are applied. The other configuration of the pump 10I is similar to that of the pump 10, and the description of the similar configuration will be omitted.

As illustrated in FIG. 12, the coating agents 600 are applied to regions of the flat plates 20 and 30 and the shielding plate 500 that face the movable regions of the film valves 61 and 62.

By configuring as described above, the damage caused by the film valves 61 and 62 coming into contact with the flat plates 20 and 30 and the shielding plate 500 can be suppressed.

Note that the primary component of the coating agent may be a resin having a Young's modulus lower than those of the flat plates 20 and 30 and the shielding plate 500, such as silicone rubber or PTFE. Since these coating agents each have a low Young's modulus, the impact when the film valve comes into contact therewith can be reduced, and the damage to the film valve can be suppressed.

Note that it is more preferable that the coating agent 600 contain fluorine or molybdenum disulfide as the primary component. Since the surfaces of these coating agents have lubricity, the damage to the film valves 61 and 62 due to friction with the flat plates 20 and 30 and the shielding plate 500 can also be suppressed.

Note that the coating agent 600 may not be applied to all of the flat plates 20 and 30 and the shielding plate 500. Similar effects can be obtained even when the agent is applied to only some members.

Note that the configurations of the above-described embodiments can be combined as appropriate, and the functions and effects corresponding to the respective combinations can be obtained.

10, 10A, 10B, 10C, 10D, 10E, 10F, 10G PUMP
20, 30, 50 FLAT PLATE
21, 211, 212, 213, 214, 215, 216 PIEZOELECTRIC ELEMENT
22, 32, 321, 322 SUPPORT MEMBER
23, 33, 331, 332 VENTILATION HOLE
40, 40B, 40C, 40G SIDE WALL
51, 201, 301, 511 THICK PORTION
61, 62, 63, 64 FILM VALVE
71, 72, 73, 74 BONDING MEMBER
101, 102 PUMP CHAMBER
401, 402, 403, 405, 406 SIDE WALL MEMBER
450 VENTILATION HOLE
500, 501, 502 SHIELDING PLATE

The invention claimed is:

1. A pump comprising:
   a first flat plate having one main surface and another main surface facing each other;
   a second flat plate having one main surface facing the one main surface of the first flat plate;
   a piezoelectric element arranged on the first flat plate;
   a side wall arranged on an outer side relative to outer edges of the first flat plate and the second flat plate;
   a first support member supporting the outer edge of the first flat plate and the side wall;
   a second support member supporting the outer edge of the second flat plate and the side wall;
   a first shielding plate arranged between the first flat plate and the second flat plate, facing the first flat plate and the second flat plate at the outer edges of the first flat plate and the second flat plate, having an opening at a center, and fixed to the side wall;
   a first ventilation hole provided between the outer edge of the first flat plate and the side wall;
   a second ventilation hole provided between the outer edge of the second flat plate and the side wall;
   a first valve body arranged in a region where the first flat plate and the first shielding plate face each other; and
   a second valve body arranged in a region where the second flat plate and the first shielding plate face each other,
   wherein a center side of one of the first valve body and the second valve body is fixed in a state in which an outer edge side of the one of the first valve body and the second valve body is movable, and an outer edge side of another one of the first valve body and the second valve body is fixed in a state in which a center side of the other one of the first valve body and the second valve body is movable.

2. The pump according to claim 1,
   wherein the outer edge of the first flat plate is supported by the first support member such that the first flat plate is capable of vibrating.

3. The pump according to claim 1,
   wherein a distance between the first flat plate and the first shielding plate in the region where the first flat plate and the first shielding plate face each other is shorter than a distance between the first support member and the first shielding plate.

4. The pump according to claim 1,
   wherein a distance between the second flat plate and the first shielding plate in the region where the second flat plate and the first shielding plate face each other is shorter than a distance between the second support member and the first shielding plate.

5. The pump according to claim 1, the pump includes:
   a third flat plate arranged on a side of the other main surface of the first flat plate, and having one main surface facing the other main surface;
   a third support member supporting an outer edge of the third flat plate and the side wall;
   a second shielding plate arranged between the first flat plate and the third flat plate, facing the first flat plate and the third flat plate at the outer edges, having an opening at a center, and fixed to the side wall;
   a third ventilation hole provided between the outer edge of the third flat plate and the side wall;
   a third valve body arranged in a region where the first flat plate and the second shielding plate face each other; and
   a fourth valve body arranged in a region where the third flat plate and the second shielding plate face each other,
   wherein a center side of one of the third valve body and the fourth valve body is fixed in a state in which an outer edge side of the one of the third valve body and the fourth valve body is movable, and an outer edge side of another one of the third valve body and the fourth valve body is fixed in a state in which a center side of the other one of the third valve body and the fourth valve body is movable,
   the first valve body and the third valve body are in a reversely positional relationship between a fixed portion and a movable portion.

6. The pump according to claim 1,
   wherein piezoelectric elements are arranged on both main surfaces of the first flat plate or the second flat plate.

7. The pump according to claim 1,
   wherein piezoelectric elements are arranged on the first flat plate and the second flat plate.

8. The pump according to claim 5,
   wherein piezoelectric elements are arranged on all of the first flat plate, the second flat plate, and the third flat plate.

9. The pump according to claim 1, the pump includes:
   a fourth flat plate arranged on a side of another main surface of the second flat plate, and having one main surface facing the other main surface;
   a fourth support member supporting an outer edge of the fourth flat plate and the side wall;
   a third shielding plate arranged between the second flat plate and the fourth flat plate, facing the second flat plate and the fourth flat plate at the outer edges, further having an opening at a center, and fixed to the side wall;
   a fourth ventilation hole provided between the outer edge of the fourth flat plate and the side wall;
   a fifth valve body arranged in a region where the second flat plate and the third shielding plate face each other; and
   a sixth valve body arranged in a region where the fourth flat plate and the third shielding plate face each other,
   wherein a center side of one of the fifth valve body and the sixth valve body is fixed in a state in which an outer edge side of the one of the fifth valve body and the sixth valve body is movable, and an outer edge side of another one of the fifth valve body and the sixth valve body is fixed in a state in which a center side of the other one of the fifth valve body and the sixth valve body is movable,
   the second valve body and the fifth valve body are in a reversely positional relationship between a fixed portion and a movable portion.

10. The pump according to claim 9,
    wherein the outer edge of the fourth flat plate is supported by the fourth support member such that the fourth flat plate is capable of vibrating.

11. The pump according to claim 1,
    wherein the first support member and the second support member are each comprised of a plurality of belt-shaped members each having a bent portion,
    the first ventilation hole is provided by gaps between the plurality of belt-shaped members of the first support member, and
    the second ventilation hole is provided by gaps between the plurality of belt-shaped members of the second support member.

12. The pump according to claim 1,
wherein the first support member is thinner than the first flat plate.

13. The pump according to claim 1,
wherein the first support member is comprised of a material having a Young's modulus lower than a Young's modulus of the first flat plate.

14. The pump according to claim 2,
wherein a distance between the first flat plate and the first shielding plate in the region where the first flat plate and the first shielding plate face each other is shorter than a distance between the first support member and the first shielding plate.

15. The pump according to claim 2,
wherein a distance between the second flat plate and the first shielding plate in the region where the second flat plate and the first shielding plate face each other is shorter than a distance between the second support member and the first shielding plate.

16. The pump according to claim 3,
wherein a distance between the second flat plate and the first shielding plate in the region where the second flat plate and the first shielding plate face each other is shorter than a distance between the second support member and the first shielding plate.

17. The pump according to claim 2, the pump includes:
a third flat plate arranged on a side of the other main surface of the first flat plate, and having one main surface facing the other main surface;
a third support member supporting an outer edge of the third flat plate and the side wall;
a second shielding plate arranged between the first flat plate and the third flat plate, facing the first flat plate and the third flat plate at the outer edges, having an opening at a center, and fixed to the side wall;
a third ventilation hole provided between the outer edge of the third flat plate and the side wall;
a third valve body arranged in a region where the first flat plate and the second shielding plate face each other; and
a fourth valve body arranged in a region where the third flat plate and the second shielding plate face each other,
wherein a center side of one of the third valve body and the fourth valve body is fixed in a state in which an outer edge side of the one of the third valve body and the fourth valve body is movable, and an outer edge side of another one of the third valve body and the fourth valve body is fixed in a state in which a center side of the other one of the third valve body and the fourth valve body is movable,
the first valve body and the third valve body are in a reversely positional relationship between a fixed portion and a movable portion.

18. The pump according to claim 3, the pump includes:
a third flat plate arranged on a side of the other main surface of the first flat plate, and having one main surface facing the other main surface;
a third support member supporting an outer edge of the third flat plate and the side wall;
a second shielding plate arranged between the first flat plate and the third flat plate, facing the first flat plate and the third flat plate at the outer edges, having an opening at a center, and fixed to the side wall;
a third ventilation hole provided between the outer edge of the third flat plate and the side wall;
a third valve body arranged in a region where the first flat plate and the second shielding plate face each other; and
a fourth valve body arranged in a region where the third flat plate and the second shielding plate face each other,
wherein a center side of one of the third valve body and the fourth valve body is fixed in a state in which an outer edge side of the one of the third valve body and the fourth valve body is movable, and an outer edge side of another one of the third valve body and the fourth valve body is fixed in a state in which a center side of the other one of the third valve body and the fourth valve body is movable,
the first valve body and the third valve body are in a reversely positional relationship between a fixed portion and a movable portion.

19. The pump according to claim 4, the pump includes:
a third flat plate arranged on a side of the other main surface of the first flat plate, and having one main surface facing the other main surface;
a third support member supporting an outer edge of the third flat plate and the side wall;
a second shielding plate arranged between the first flat plate and the third flat plate, facing the first flat plate and the third flat plate at the outer edges, having an opening at a center, and fixed to the side wall;
a third ventilation hole provided between the outer edge of the third flat plate and the side wall;
a third valve body arranged in a region where the first flat plate and the second shielding plate face each other; and
a fourth valve body arranged in a region where the third flat plate and the second shielding plate face each other,
wherein a center side of one of the third valve body and the fourth valve body is fixed in a state in which an outer edge side of the one of the third valve body and the fourth valve body is movable, and an outer edge side of another one of the third valve body and the fourth valve body is fixed in a state in which a center side of the other one of the third valve body and the fourth valve body is movable,
the first valve body and the third valve body are in a reversely positional relationship between a fixed portion and a movable portion.

20. The pump according to claim 2,
wherein piezoelectric elements are arranged on both main surfaces of the first flat plate or the second flat plate.

* * * * *